(12) United States Patent
Stevens

(10) Patent No.: US 6,376,374 B1
(45) Date of Patent: *Apr. 23, 2002

(54) PROCESS AND MANUFACTURING TOOL ARCHITECTURE FOR USE IN THE MANUFACTURING OF ONE OR MORE PROTECTED METALLIZATION STRUCTURES ON A WORKPIECE

(75) Inventor: E. Henry Stevens, Colorado Springs, CO (US)

(73) Assignee: Semitool, Inc., Kalispell, MT (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/076,565

(22) Filed: May 12, 1998

(51) Int. Cl.[7] ............................................... H01L 22/44
(52) U.S. Cl. ........................................ 438/687; 438/643
(58) Field of Search ................................. 438/643, 687

(56) References Cited

U.S. PATENT DOCUMENTS 5,827,604 A * 10/1998 Uno et al. .................. 428/209
5,913,144 A * 6/1999 Nguyen et al. ............. 438/643

* cited by examiner

Primary Examiner—Son L. Mai
Assistant Examiner—Reneé R. Berm
(74) Attorney, Agent, or Firm—Polit & Associates, LLC

(57) ABSTRACT

A process for providing one or more protected copper elements on a surface of a workpiece is set forth. In accordance with the process, a barrier layer is applied to the workpiece. If the barrier layer is not suitable as a seed layer for subsequent electroplating processes, a separate seed layer is applied over the surface of the barrier layer. One or more copper elements are then electroplated on selected portions of the seed layer or, if suitable, the barrier layer. If used, the seed layer is then substantially removed. At least a portion of a surface of the barrier layer is rendered unplatable while leaving the copper elements suitable for electroplating. A protective layer is then electroplated onto surfaces of the one or more copper elements.

51 Claims, 6 Drawing Sheets

PROCESS AND MANUFACTURING TOOL ARCHITECTURE FOR USE IN THE MANUFACTURING OF ONE OR MORE PROTECTED METALLIZATION STRUCTURES ON A WORKPIECE

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

An integrated circuit is an interconnected ensemble of devices formed within a semiconductor material and within a dielectric material that overlies a surface of the semiconductor material. Devices which may be formed within the semiconductor material include MOS transistors, bipolar transistors, diodes and diffused resistors. Devices which may be formed within the dielectric include thin-film resistors and capacitors. Typically, more than 100 integrated circuit die (IC chips) are constructed on a single 8 inch diameter silicon wafer. The devices utilized in each dice are interconnected by conductor paths formed within the dielectric. Typically, two or more levels of conductor paths, with successive levels separated by a dielectric layer, are employed as interconnections. In current practice, an aluminum alloy and silicon oxide are typically used for, respectively, the conductor and dielectric.

Delays in propagation of electrical signals between devices on a single dice limit the performance of integrated circuits. More particularly, these delays limit the speed at which an integrated circuit may process these electrical signals. Larger propagation delays reduce the speed at which the integrated circuit may process the electrical signals, while smaller propagation delays increase this speed. Accordingly, integrated circuit manufacturers seek ways in which to reduce the propagation delays.

For each interconnect path, signal propagation delay may be characterized by a time delay $\tau$. See E. H. Stevens, *Interconnect Technology*, QMC, Inc., July 1993. An approximate expression for the time delay, $\tau$, as it relates to the transmission of a signal between transistors on an integrated circuit is given by the equation:

$$\tau = RC[1 + (V_{SAT}/RI_{SAT})]$$

In this equation, R and C are, respectively, an equivalent resistance and capacitance for the interconnect path, and $I_{SAT}$ and $V_{SAT}$ are, respectively, the saturation (maximum) current and the drain-to-source potential at the onset of current saturation for the transistor that applies a signal to the interconnect path. The path resistance is proportional to the resistivity, $\rho$, of the conductor material. The path capacitance is proportional to the relative dielectric permittivity, $K_e$, of the dielectric material. A small value of $\tau$ requires that the interconnect line carry a current density sufficiently large to make the ratio $V_{SAT}/RI_{SAT}$ small. It follows, therefore, that a low-$\rho$ conductor which can carry a high current density and a low-$K_e$ dielectric should be utilized in the manufacture of high-performance integrated circuits.

To meet the foregoing criterion, copper interconnect lines within a low-$K_e$ dielectric will likely replace aluminum-alloy lines within a silicon oxide dielectric as the most preferred interconnect structure. See "Copper Goes Mainstream: Low-k to Follow", *Semiconductor International*, November 1997, pp. 67–70. Resistivities of copper films are in the range of 1.7 to 2.0 $\mu\Omega$cm. while resistivities of aluminum-alloy films are higher in the range of 3.0 to 3.5 $\mu\Omega$cm.

Despite the advantageous properties of copper, several problems must be addressed for copper interconnects to become viable in large-scale manufacturing processes.

Diffusion of copper is one such problem. Under the influence of an electric field, and at only moderately elevated temperatures, copper moves rapidly through silicon oxide. It is believed that copper also moves rapidly through low-$K_e$ dielectrics. Such copper diffusion causes failure of devices formed within the silicon.

Another problem is the propensity of copper to oxidize rapidly when immersed in aqueous solutions or when exposed to an oxygen-containing atmosphere. Oxidized surfaces of the copper are rendered non-conductive and thereby limit the current carrying capability of a given conductor path when compared to a similarly dimensioned non-oxidized copper path.

In view of the foregoing problems, the present inventor has recognized that copper metallization layers need an effective barrier material to prevent copper diffusion and an effective protective layer over the copper metallization to prevent oxidation of the copper. Existing processes for manufacturing such metallization layers are inefficient and are not economically viable for use in large-scale manufacturing operations.

BRIEF SUMMARY OF THE INVENTION

A process for providing one or more protected copper elements on a surface of a workpiece is set forth. In accordance with the process, a barrier layer is applied to the workpiece. If the barrier layer is not suitable as a seed layer for subsequent electroplating processes, a separate seed layer is applied over the surface of the barrier layer. One or more copper elements are then electroplated on selected portions of the seed layer or, if suitable, the barrier layer. If used, the seed layer is then substantially removed. At least a portion of a surface of the barrier layer is rendered unplatable while leaving the copper elements suitable for electroplating. A protective layer is then electroplated onto surfaces of the one or more copper elements.

A tool architecture for implementing the foregoing process is also set forth. The disclosed tool architecture may be used to minimize the number of wafer movements between the tool sets required to form a complete metallization layer structure.

The present invention provides a process and corresponding processing tool architecture that facilitates the implementation of efficient and economically viable large-scale manufacturing processes for use in making workpieces, wherein each workpiece has protected copper conductive elements disposed exterior to a barrier layer of the workpiece. The process and tool architecture, although applicable to a wide range of workpiece applications (semiconductor workpiece applications as well as non-semiconductor workpiece applications), are particularly suitable for use in the manufacture of one or more metallization levels of a semiconductor integrated circuit. In the particular embodiment of the process and tool architecture disclosed herein, the resulting protected metallization structure may be readily manufactured using a minimal number of processing tool sets and a minimal number of workpiece movements between the tool sets.

DETAILED DESCRIPTION OF THE INVENTION

A basic understanding of certain terms used herein will assist the reader in understanding the disclosed subject matter. To this end, basic definitions of certain terms, as used in the present disclosure, are set forth below.

Single Metallization Level is defined as a composite level of a workpiece that is exterior to the substrate. The composite level comprises one or more interconnect lines and one or more interconnect posts that are substantially covered by a dielectric layer so that the dielectric layer insulates selected interconnect lines and interconnect posts that are not designed to be interconnected from one another.

Substrate is defined as a base layer of material over which one or more metallization levels are disposed. The substrate may be, for example, a semiconductor wafer, a ceramic block, etc.

Workpiece is defined as an object that at least comprises a substrate, and may include further layers of material or manufactured components, such as one or more metallization levels, disposed on the substrate.

Figure 1:
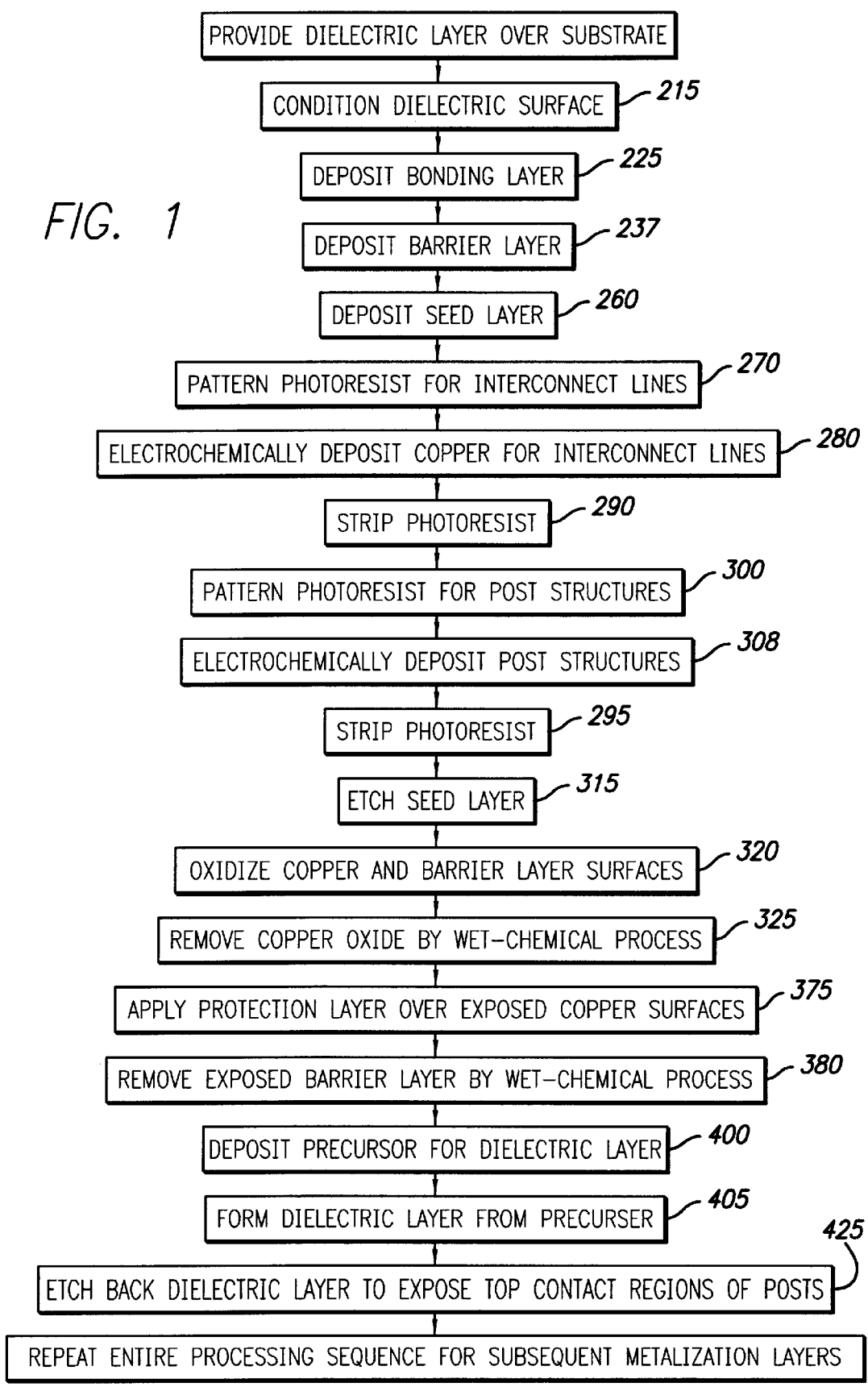
FIG. 1 is a process flow chart illustrating one manner of implementing an interconnect metallization structure in accordance with one embodiment of the present invention.
Figure 2A:
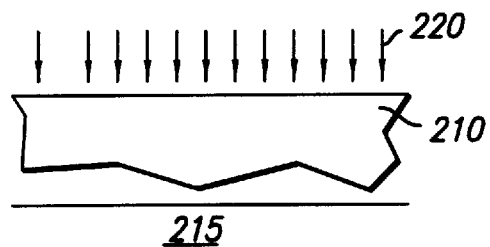
FIGS. 2A–2K illustrate an interconnect metallization structure formed using the process of FIG. 1 at various stages of the metallization level development.

One embodiment of the basic process employed to form the disclosed protected metallization structure is set forth in the flow chart of FIG. 1 while the corresponding formation of one embodiment of the metallization structure at various processing states is illustrated in FIG. 2A–2K. As shown in FIGS. 1 and 2A, a generally planarized dielectric layer 210 is provided over a substrate 215, such as a semiconductor wafer. Although not specifically shown in FIG. 2A, the dielectric layer 210 likely includes contacts to metal-filled vias exposed at the top of the dielectric layer that have been generally planarized and that provide an electrical connection between one or more components below the surface of the dielectric layer. The one or more components below the surface of the dielectric layer may include a further interconnect metallization level, a direct connection to a semiconductor component formed in the substrate, etc. The dielectric layer 210 preferably has a relative permittivity of less than 4 and may be formed by spin application or spray application of a precursor material or precursor materials followed by a cure, in either an anaerobic or in an oxygen-containing atmosphere, at a temperature of less than 450 C. A preferred choice for the dielectric material is benzocyclobutene (BCB).

Preferably, the surface of the dielectric layer 210 is conditioned, as at step 215, to enhance the adhesion of a subsequently applied layer. The surface of the dielectric layer 210 may be conditioned using wet or dry chemical processes or through an ion milling process. The arrows 220 in FIG. 2A depict conditioning of the upper surface of the dielectric layer 210 by, for example, impinging argon or nitrogen ions. Alternatively, the upper surface may be conditioned by a brief (10 to 30 second) etch in a solution comprised of 1% to 2% hydrofluoric acid in deionized water.

Figure 2B:
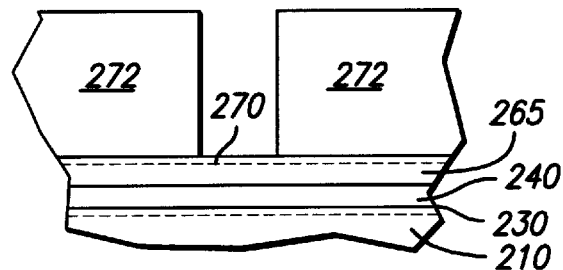

As illustrated at FIG. 2B and at step 225 of FIG. 1, an optional bonding layer 230 may be applied to the surface of the dielectric layer 210. The bonding layer 230 may be comprised of titanium, or chromium which has been deposited using a vapor deposition technique such as PVD.

At step 237 of FIG. 1, a barrier layer 240 is deposited over the bonding layer 230, if used, or directly onto the surface of the dielectric layer 210. The barrier layer 240, as illustrated, is deposited over a generally planar surface of a semiconductor workpiece thereby eliminating the need to apply the barrier layer material into high aspect ratio trenches and vias. Depending on the properties of other materials incorporated within the interconnect structure, the barrier layer 240 may be comprised of tantalum, tantalum nitride, titanium nitride, titanium oxynitride, titanium-tungsten alloy, or tungsten nitride. A composite barrier comprised of two layers, as taught by Stevens in U.S. Pat. No. 4,977,440 and in U.S. Pat. No. 5,070,036 may be used for contact to semiconductor device terminals. It is further noted that a deposited bonding layer is not required to achieve acceptable adhesion between a tantalum barrier layer and a properly-conditioned surface of a BCB dielectric layer 210.

The barrier layer 240 may be made to be sufficiently conductive to facilitate a subsequent electrochemical deposition process for depositing interconnect line and post metallization. However, if the conductivity of the barrier layer 240 is insufficient, a seed layer may be required.

FIG. 2B and step 260 of FIG. 1 illustrate application of a seed layer 265 that is deposited, for example, in a PVD or CVD process. The seed layer 265 is typically copper, but may also be comprised of metals such as nickel, iridium, platinum, palladium, chromium, vanadium or other conductive materials such as iridium oxide. Preferred thicknesses for the seed and barrier layers are in the range of 200 to 600 Å.

Referring again to FIG. 2B and step 270 of FIG. 1, procedures well-established in the photolithographic arts may be employed to deposit the interconnect line pattern using, for example, photoresist 272 as a mask. In such instances, a plasma treatment may be included as a final step in the photolithographic procedure or at any processing stage prior to the electrochemical deposition of the interconnect line metallization in order to remove photoresist residues from exposed portions of the seed layer surface. A treatment in HMDS may be employed to form a layer 270 that promotes adhesion between photoresist and the copper seed layer 265. Additionally, or alternatively, a thin (less than 100 Å) layer of copper oxide may be formed on the upper surface of the seed layer 265 to form layer 270 and thereby promote adhesion between the seed layer and photoresist.

Figure 2C:
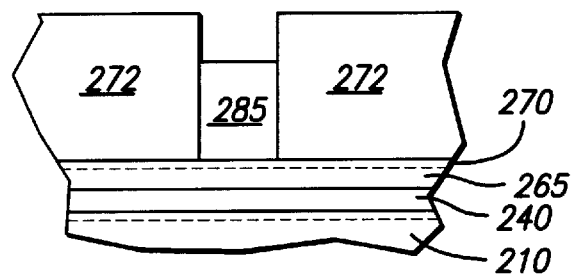

Referring to FIG. 2C and step 280 of FIG. 1, interconnect line metallization 285 is formed by selective electrochemical deposition of, for example, copper into the photoresist interconnect pattern. An acidic chemical bath is preferably employed for the electrochemical depositions. The chemical bath may be prepared by adding copper sulfate and sulfuric acid to deionized water. As is well known in the metals-plating arts, small concentrations of materials which affect metal grain size and film conformability may optionally be included in the chemical bath.

Figure 2D:
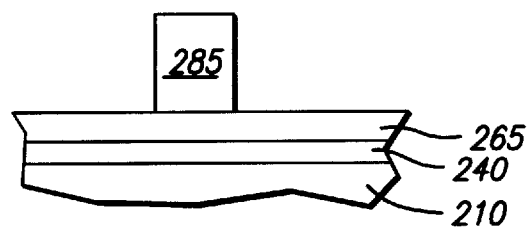

After the interconnect metallization 285 has been deposited into the photoresist interconnect pattern, the photoresist is removed. Removal of the photoresist may be accomplished by exposing the photoresist to a solvent or oxidant (such as ozonated DI water) followed by a rinse in water. Such a step is illustrated at steps 290 and 295 of FIG. 1 and should be sufficient to remove photoresist after selective metal depositions. The resultant structure is shown in FIG. 2D.

Figure 2E:
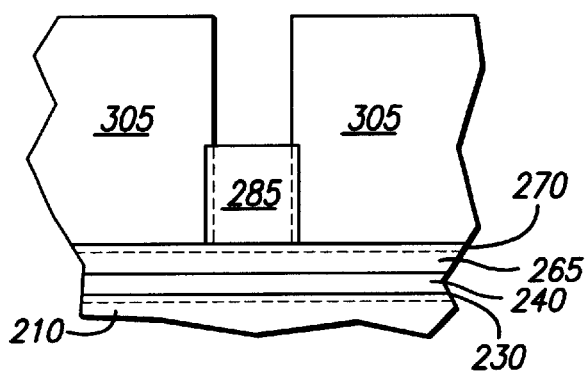
Figure 2F:
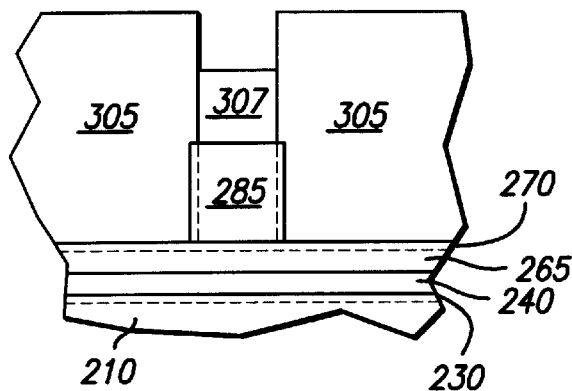
Figure 2G:
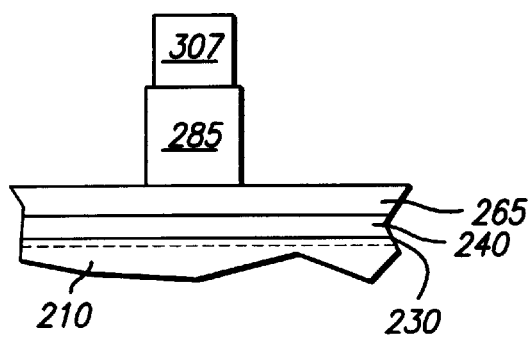

As illustrated at FIG. 2E and at step 300 of FIG. 1, a further photoresist pattern 305 is applied to the semiconductor workpiece in order to form openings through which the post metallization 307 may be electrochemically deposited as at step 308. A metallized post 307 is shown in FIG. 2F. After the post metallization has been deposited, the photoresist pattern is removed thereby leaving the interconnect structure of FIG. 2G.

Figure 2H:
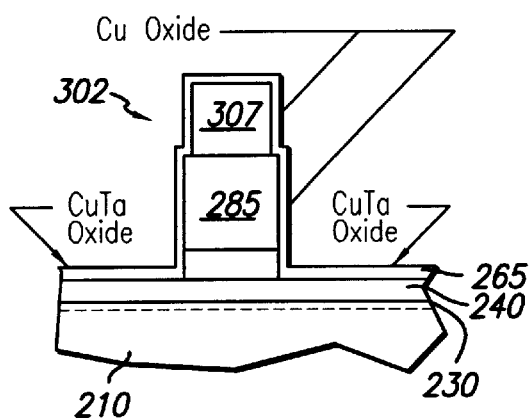

Referring now to FIG. 2H and to steps 315 of FIG. 1, the seed layer 265 is partially or completely removed by, for example, an electrochemical etching process. Electrochemical etching may be accomplished by exposing the seed layer to a suitable electrolyte solution, such as a solution containing phosphoric acid, while the seed layer 265 is held at a positive electrical potential relative to an electrode that is immersed in the electrolyte solution.

Shown in FIG. 2H is a representative cross section after partial removal of the exposed seed layer followed by formation of copper tantalum oxide on the exposed surface of the barrier layer and formation of copper oxide on exposed surfaces of lines and posts, the oxidation being accomplished in step 320. As detailed above, the seed layer 265 may be partially removed by immersion in electrolyte solution which contains phosphoric acid while the seed layer is held at a positive electrical potential relative to an electrode that is immersed in the same electrolyte solution. The seed layer that remains after electrochemical etching is converted to copper oxide. Alternatively, when seed layer thickness is less than about 10% of minimum line width, the electrochemical etch may be omitted and the seed layer may be completely converted to copper oxide. Referring to step 320, exposed surfaces of the copper structures 285, 307, and 265 and the barrier layer 240 are oxidized by exposure to a solution comprised of air, oxygen or ozone dissolved in water. Alternatively, the surfaces may be oxidized by heating in an oxygen containing atmosphere. As illustrated at step 325, the resultant copper oxide may be removed by exposure to a solution which contains sulfuric acid, hydrochloric acid, or both sulfuric and hydrochloric acid.

Oxidation of the barrier layer and copper and the subsequent removal of the resulting copper oxide from the copper interconnect structure advantageously provides surfaces that can be selectively electroplated with a protective layer. In the disclosed structure, a protective layer is preferably provided on the interconnect structure 302, but is preferably not provided on the surface of the barrier layer. The formation of the copper oxide on the interconnect structure 302 and its subsequent removal leaves exposed conductive copper at the interconnect structure surface. The oxidation of the seed layer and barrier layer materials leaves a barrier layer surface comprised of non-conductive, copper-tantalum oxide. As a result of this processing, the surface of the interconnect structure 302 is readily subject to electroplating of a protective layer thereon, while the barrier layer is not.

A protective coating 370 is preferably provided over the remaining interconnect structures. Such a protective coating is preferably formed in an electrochemical process, such as at steps 375, that causes a material to deposit on the exposed copper but not on the oxide-coated, exposed barrier material. Materials for the protective coating preferably include those which impede copper migration into the dielectric and, further, which impede oxidation of the coated copper. Materials that may be employed for the protective coating include nickel, nickel alloys and chromium. Preferred thicknesses for the protective coating are in the range of 50 Å to 500 Å.

Figure 2I:
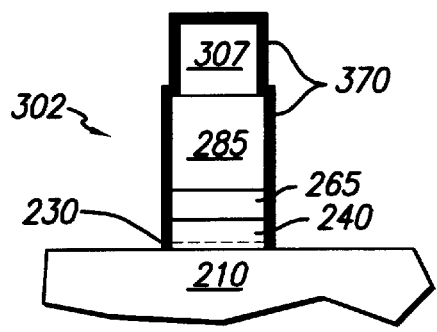

Referring to step 380 of FIG. 1, the barrier layer 240 and its overlying oxide layer may be removed where it is not covered by an overlying copper feature by a wet-chemical etch, provided that the barrier removal procedure does not excessively attack either copper features of the interconnect structure 302 or the dielectric 210 that underlies the barrier layer 240. When the barrier layer comprises tantalum, the etchant preferably comprises 1% to 5% hydrofluoric acid in water. The resultant structure is shown at FIG. 2I.

Figure 2J:
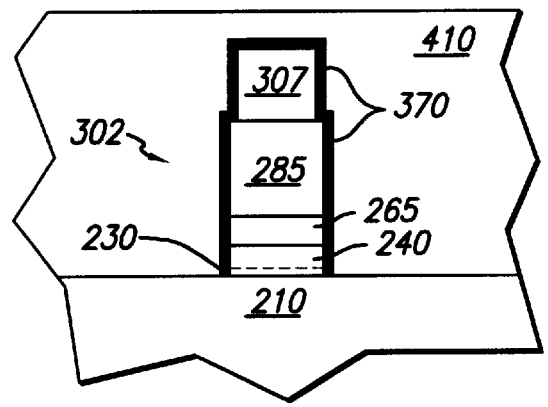

As illustrated at FIG. 2J and at steps 400 and 405 of FIG. 1, a further dielectric layer 410 is formed to a thickness sufficient to cover the upper surfaces of post of the interconnect structure. The further dielectric layer 410 is preferably formed by spin application or spray application of a precursor material or precursor materials followed by a cure, in either an anaerobic or in an oxygen-containing atmosphere, at a temperature of less than 450 C. Composition of the dielectric layer 410 may be different than or the same as composition of the dielectric layer 210.

Figure 2K:
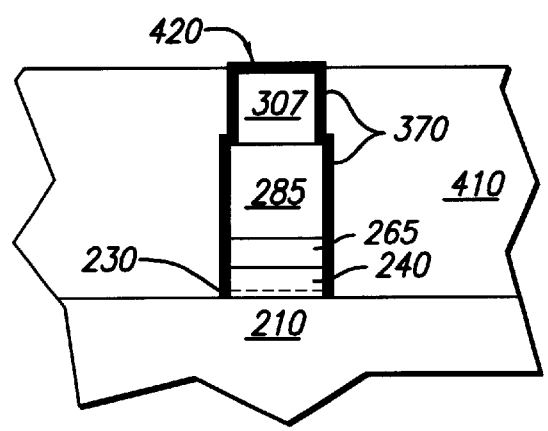

After the further dielectric layer 410 has been cured, the upper surface of the layer 410 is etched back to expose the upper contact regions 420 of the post structure 307. For example, a blanket plasma etch may be employed to reduce the thickness of layer 410 until all upper surfaces 420 of the post structures 307 are exposed. Etching of BCB, for example, may be done in a plasma that contains oxygen and fluorine ions. Such a step is illustrated at step 425 of FIG. 1 and the structure is shown at FIG. 2K.

Figure 3:
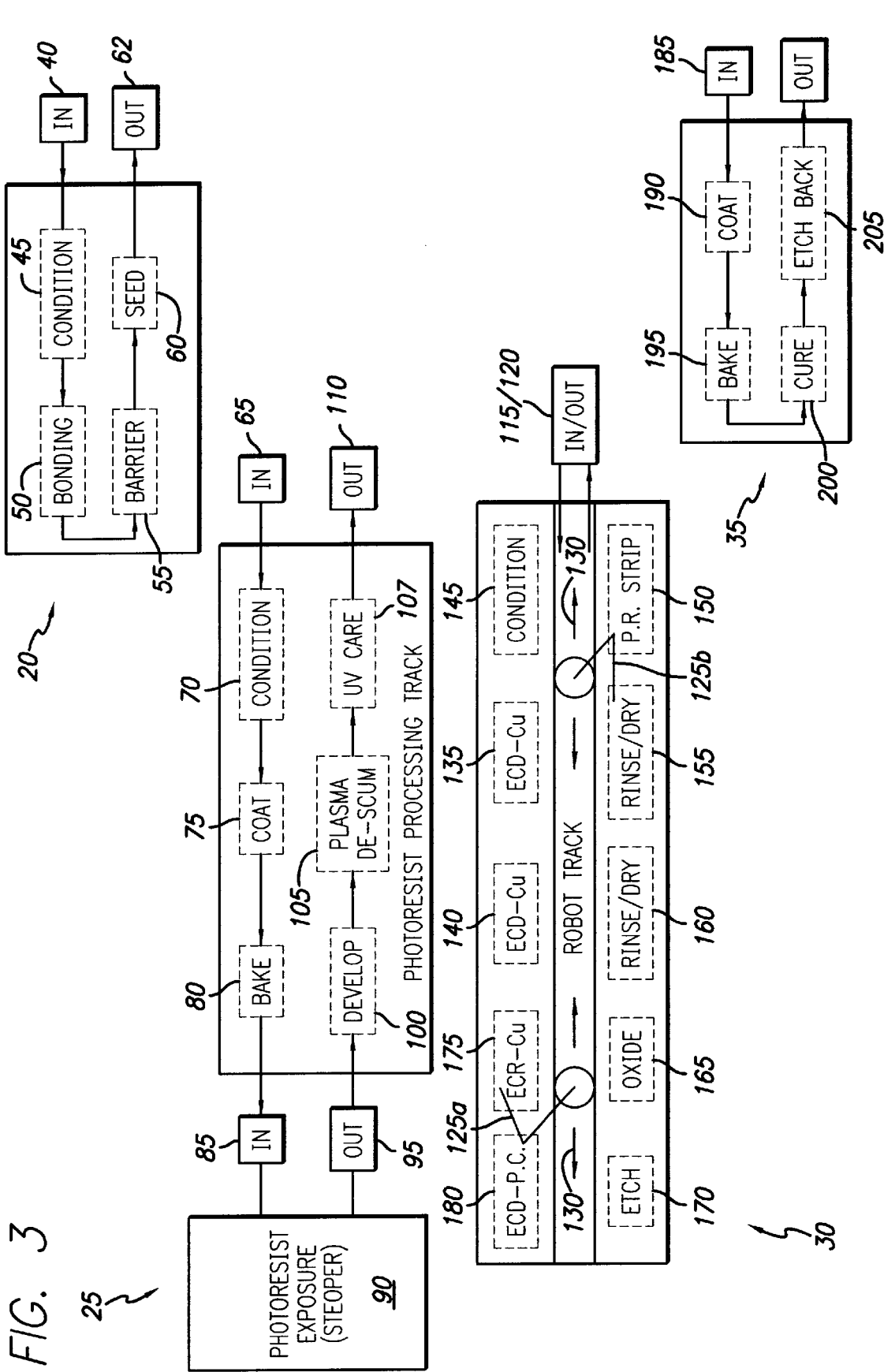
FIG. 3 illustrates one manner of configuring tool sets for implementing the process set forth in FIG. 1.

The basic tool sets for implementing a tool architecture in accordance with one embodiment of the present invention is illustrated in FIG. 3. As shown, the tool sets comprise a film deposition tool set 20, a pattern processing tool set 25, a wet processing tool set 30, and a dielectric processing tool set 35.

In the disclosed embodiment of FIG. 3, the film deposition tool set 20 is preferably a vacuum deposition tool set. As will become apparent from the subsequent discussion of the processing operations performed on the workpiece, the film deposition tool set 20 deposits one or more films on generally planar surfaces of the workpiece. Such film deposition is preferable to depositing the films in the micro-recessed features employed in processing damascene interconnect structures. As such, low cost vacuum deposition techniques, such as physical vapor deposition (PVD), may be employed. Chemical vapor deposition (CVD) processes may also be employed.

The particular embodiment of the film deposition tool set 20 shown in FIG. 3 includes an input station 40 disposed to receive workpieces. The input station 40 may be configured to accept the workpieces in multi-workpiece cassettes or in multi-workpiece or single-workpiece hygienic pods. Workpieces are transferred from the input station 40 to a plurality of processing stations. Preferably, the workpieces are first transferred to a conditioning station 45 where the surface of a generally planar dielectric layer disposed exterior to the workpiece substrate is treated to enhance adhesion of a subsequent film layer. Such adhesion enhancement of the dielectric layer can be accomplished using any one or more known dry chemical processes. Depending on the characteristics of the dielectric layer and the subsequent film layer, adhesion enhancement may not be necessary. In such instances, the conditioning station 45 need not be included in the film deposition tool set 20.

Each workpiece is then provided to a bonding film application station 50 where an optional bonding layer is applied exterior to (preferably, directly on) the dielectric layer. Materials suitable for the bonding layer include aluminum, titanium, and chromium. Preferably, such materials for the bonding layer are deposited using a vapor deposition technique, such as PVD or CVD. Depending on the properties of adjacent film layers, the bonding layer may not be desired and, as such, the bonding film application station 50 need not be included in the film deposition tool set 20.

A barrier layer application station 55 is disposed within the film deposition tool set 20 to apply a barrier layer material exterior to the dielectric material of the workpiece. Depending on properties of other materials incorporated within the interconnect structure, the barrier layer may be comprised of tantalum, tantalum nitride, titanium nitride, titanium oxynitride, titanium-tungsten alloy, or tungsten nitride. Particularly when the interconnect level makes contact to terminals of semiconductor devices, it is advantageous to employ a composite barrier comprised of two layers, as taught by Stevens in U.S. Pat. No. 4,977,440 and in U.S. Pat. No. 5,070,036. The barrier layer may be formed using a vacuum deposition process such as PVD or CVD.

To augment the conductivity of the barrier layer and to provide for good adhesion of subsequently formed layers, the film deposition tool set 20 preferably includes a seed layer application station 60. The seed layer application station 60 preferably deposits the seed layer using a PVD or CVD process. The seed layer is preferably copper, but seed layers may also be comprised of metals such as nickel, iridium, platinum, palladium, chromium, vanadium or other conductive materials such as iridium oxide. After the seed layer has been applied, the workpieces are transferred to an output station 62 for subsequent transfer to other processing tool sets.

The pattern processing tool set 25 includes a plurality of processing stations which are used to provide an interconnect line pattern over the seed layer applied by the film deposition processing tool set 20. The pattern processing tool set 25 is also used to provide a post pattern over the interconnect metallization that is formed using the interconnect line pattern. As will be set forth in further detail below, the interconnect line pattern defines the regions in which primary conductor paths are provided for horizontal electrical interconnection in a plane of the workpiece, while the post pattern defines the regions in which primary conductor paths are provided for vertical electrical connections between adjacent planes of the workpiece.

In the tool set embodiments illustrated in FIG. 3, the pattern processing tool set 25 is a photolithography tool set. The pattern processing tool set 25, as such, includes an input station 65 receiving workpieces in multi-workpiece cassettes or in single-workpiece or multi-workpiece hygienic pods. The workpieces undergo standard photolithographic conditioning, coating, and baking processes at processing stations 70, 75, and 80, respectively. After the photoresist is baked onto the semiconductor workpiece at station 80, the workpiece is transferred to the input station 85 of a photoresist exposure apparatus 90. The photoresist exposure apparatus 90 may be, for example, a step and repeat apparatus that exposes the photoresist to ultra-violet light in a manner that selectively affects the photoresist layer so that portions of the photoresist layer may be subsequently removed to form the interconnect line or post patterns.

After processing in the photoresist exposure apparatus 90, the workpiece is provided to the output station 95 of the apparatus 90 for transfer to further processing stations that selectively remove the photoresist layer to form a pattern in the layer consistent with the pattern exposure in the photoresist exposure apparatus 90. Such processing stations include a photoresist development station 100 and a plasma cleaning (de-scum) station 105. After selective removal of the photoresist layer and plasma cleaning, the workpieces may be transferred to an output station 110 or, optionally, to an intermediate UV cure station 107 and therefrom to output station 110 for provision to one or more further tool sets.

The wet processing tool set 30 implements a wide range of processes used to form the interconnect metallization and post metallization structures. The wet processing tool set 30 may be implemented in an LT-210™ brand copper plating tool available from Semitool, Inc., of Kalispell, Mont. Such a wet processing tool set preferably includes input station 115 for receiving workpieces in multi-workpiece cassettes or in single-workpiece or multiple-workpiece pods, and an output station 120 for supplying processed workpieces in pods or cassettes to one or more subsequent tool sets. Stations 115 and 120 are preferably combined into a single input/output station. Dual robot arms 125*a* and 125*b* are disposed for travel in the direction of arrows 130 and are used to transfer the workpieces between a plurality of processing stations and to and from the output station 120 and input station 115.

The processing stations of the wet processing tool set 30 perform at least three primary wet processing operations. First, the wet processing tool set 30 includes processing stations used to apply copper metallization, using an electrochemical deposition process, into the interconnect line pattern and the post pattern formed by the pattern processing tool set 25. To this end, electrochemical deposition stations 135 and 140 are provided. Additionally, a conditioning station 145 may be employed to condition surfaces of the semiconductor workpiece that are to be electrochemically deposited with copper. Second, the wet processing tool set 30 includes one or more processing stations used to remove the material that is used to form the interconnect line pattern and the post pattern that is applied by the pattern processing tool set 25. Processing station 150 and rinse/dry stations 155 and 160 are included for this purpose. Finally, one or more processing stations are employed to either remove portions of the seed layer and/or barrier layer that are not overlied by interconnect lines of metallization and/or to otherwise render such portions non-conductive. As will be set forth in further detail below, conditioning station 145, oxidizing station 165, etching station 170, and electrochemical removal station 175 may be used for such seed layer and barrier layer processing.

Optionally, the processing tool 30 may be used to apply a protective coating over the interconnect line metallization and post metallization. In the illustrated embodiment, electrochemical deposition station 180 may be used for this purpose. Materials for the protective coating are preferably those which impede both copper migration into the dielectric and oxidation of the coated copper. Materials that may be employed for the protective coating include, for example, nickel, nickel alloys and chromium.

The dielectric processing tool set 35 includes a plurality of processing stations that are used to deposit a dielectric layer over the interconnect line metallization and post metallization. Additionally, the dielectric processing tool set 35 includes one or more processing stations for etching the deposited dielectric layer to expose upper connection regions of the post metallization. In the illustrated embodiment, the dielectric processing tool set 35 includes an input station 185 that is adapted to receive workpieces in multi-workpiece cassettes or in single-workpiece or multiple-workpiece hygienic pods. Workpieces are provided from the input station 185 to a coating station 190 where the surface of each semiconductor workpiece is coated with a dielectric precursor or the like. After the workpiece has been coated, it is sequentially supplied to a baking station 195 and a curing station 200 to complete formation of a dielectric material that surrounds the interconnect line metallization and post metallization. The workpiece is then supplied to an etch back station 205 where the upper surface of the dielectric layer is etched back to expose upper connection regions of the post metallization. Finally, the workpiece is transferred to output station 210 for subsequent transfer to other toolsets.

Referring again to FIG. 3, the separate input and output stations 40 and 62 for tool set 20 may optionally be combined in a single input/output station. Similarly, separate input and output stations 65 and 110 of tool set 25 may optionally be combined in a single input/output station, and the single input/output stations 115,120 for tool set 30 may optionally be divided into separate input and output stations. Separate input and output stations 185 and 210 for tool set 35 may also optionally be combined in a single input/output station. At any time one or more cassettes or pods may be present in an input/output station.

Figure 4:
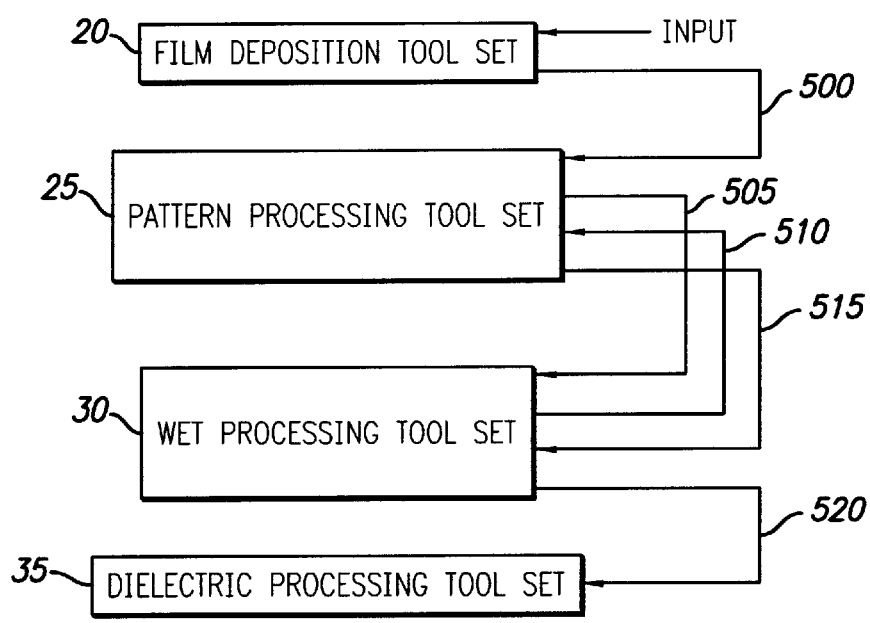
FIG. 4 illustrates a tool set architecture and corresponding workpiece movements for implementing the process shown in FIG. 1.

With reference to FIG. 4, the processing tool sets described in connection with FIG. 3 may be used to implement the manufacturing process procedures described below in connection with FIG. 1 with a minimal number of workpiece movements between the tool sets. Process steps 215, 225, 237 and 260 of FIG. 1 may be implemented in the film deposition tool set 20. Process steps 270 and 300 may be implemented in the pattern processing tool set 25. Process steps 280, 290, and 308 through 380 may be implemented in the wet processing tool set 30. Process steps 400 through 425 are implemented in the dielectric processing tool set 35.

As a result of the particular processing steps utilized and the allocation of the processing steps among the various tool sets, a single interconnect metallization level comprising one or more interconnect lines and one or more interconnect posts that are substantially surrounded by a dielectric material may be formed with no more than ten and, preferably, no more than five workpiece movements between the tool sets. To this end, a single workpiece movement, designated at arrow 500 of FIG. 4, is employed for transferring the workpieces between the film deposition tool set 20 and the pattern processing tool set 25. Three workpiece movements, designated at arrows 505, 510, and 515, are employed to transfer the workpieces between the pattern processing tool set 25 and the wet processing tool set 30. A single workpiece movement, designated at arrow 520, is employed to transfer the workpieces between the wet processing tool set 30 and the dielectric processing tool set 35. As such, the disclosed process and architecture provides a substantial reduction in the number of workpiece movements between the tool sets when compared to the traditional dual-damascene processing and tool architecture.

Figure 5:
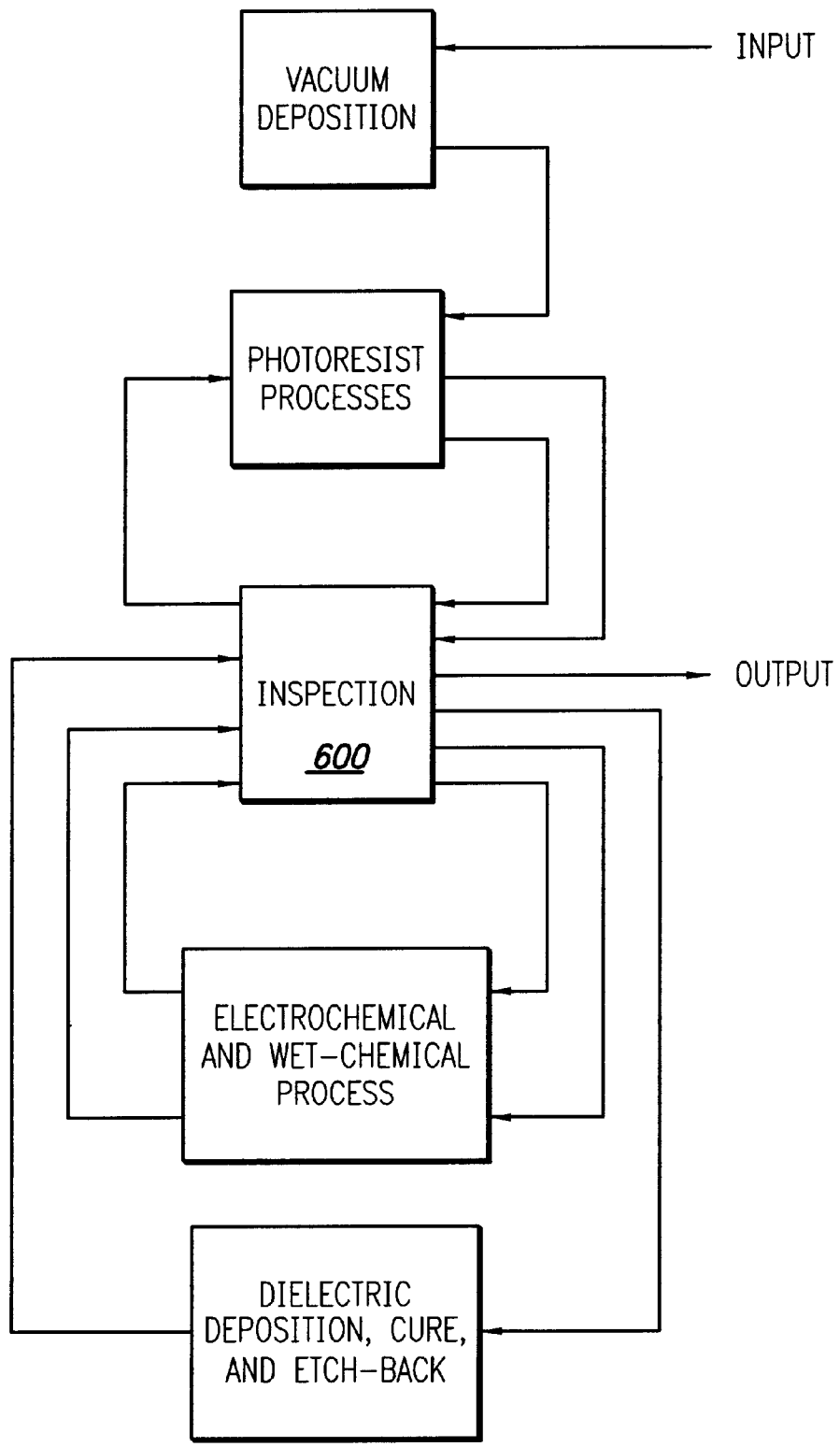
FIG. 5 illustrates a tool set architecture and corresponding workpiece movements for implementing the process shown in FIG. 1 wherein an inspection tool set is used to check the semiconductor workpieces at intermediate stages of the metallization processing.

A further embodiment of a tool architecture suitable for implementing the foregoing process steps is illustrated in FIG. 5. The tool architecture illustrated in FIG. 5 is similar to the specific embodiment of the tool sets shown in FIG. 3 as incorporated in the tool architecture of FIG. 4 (although it will be recognized that the more generic processing tool set designations of FIG. 4 may likewise be used in FIG. 5 without incorporating the specific tool set implementations disclosed in FIG. 3). However, the tool architecture of FIG. 5 includes an inspection tool set 600 that is used to check the semiconductor workpieces at intermediate stages of the application of a single metallization level. The intermediate checks are used, for example, to insure proper registration of the various photoresist patterns and corresponding metallization and, further, to insure proper dielectric etch back. As such, each semiconductor workpiece may be provided to the inspection tool set 600 after processing steps 270, 290, 300, 380 and 425 that are illustrated in FIG. 1. In the illustrated embodiment, ten workpiece movements are used to transfer the semiconductor workpiece between the various tools of the tool processing architecture to form a single interconnect metallization layer. The inspection tool set 600 may be implemented, for example, with inspection devices available from KLA-Tencor.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. A process for providing one or more protected copper elements on a surface of a workpiece, the process comprising the steps of:

applying a barrier layer to the workpiece;

applying a seed layer on the barrier layer;

electroplating one or more copper elements on selected portions of the seed layer;

substantially removing the seed layer;

rendering at least a portion of a surface of the barrier layer unplatable; and electroplating a protective layer onto surfaces of the one or more copper elements.

2. A process as claimed in claim 1 and further comprising the step of applying a dielectric layer over at least a portion of the one or more copper elements.

3. A process as claimed in claim 1 wherein the step of substantially removing the seed layer comprises the step of subjecting the seed layer to an electrolyte solution bath containing phosphoric acid while holding the seed layer at a positive electrical potential relative to an electrode that is immersed in the electrolyte solution bath.

4. A process as claimed in claim 1 and further comprising the steps of:

applying a dielectric layer to substantially cover the one or more copper elements;

removing a surface portion of the dielectric layer to expose one or more upper regions of the one or more copper elements.

5. A process as claimed in claim 1 wherein the step of rendering at least a portion of a surface of the barrier layer unplatable comprises the step of oxidizing exposed surfaces of the barrier layer material.

6. A process as claimed in claim 1 wherein the step of electroplating one or more copper elements on selected portions of the seed layer comprises the steps of:

electroplating one or more copper lines on selected portions of the seed layer; and electroplating one or more copper posts on selective portions of the copper lines.

7. A process as claimed in claim 1 wherein the step of rendering at least a portion of a surface of the barrier layer unplatable comprises the steps of:
concurrently oxidizing exposed surfaces of the barrier layer material and the one or more copper elements;
removing the resultant copper oxide from the one or more copper elements.

8. A process as claimed in claim 7 wherein the step of substantially removing the seed layer concurrently occurs during the step of removing resultant copper oxide layers from the one or more copper elements.

9. A process as claimed in claim 7 wherein the step of electroplating one or more copper elements on selected portions of the seed layer comprises the steps of:
electroplating one or more copper lines on selected portions of the seed layer; and
electroplating one or more copper posts on selective portions of the copper lines.

10. A process as claimed in claim 1 and further comprising the step of removing the barrier layer, where it is not overlied by a copper element, after electroplating the protective layer.

11. A process as claimed in claim 1 wherein the barrier layer and seed layer are applied in a first processing tool set.

12. A process as claimed in claim 11 wherein the wherein the electroplating steps and the rendering step are executed in a second processing tool set.

13. A process as claimed in claim 12 wherein the first processing tool set is a vacuum deposition tool set.

14. A process as claimed in claim 13 wherein the second processing tool set is a wet processing tool set.

15. A process as claimed in claim 11 wherein the first processing tool set is a vacuum deposition tool set.

16. A process as claimed in claim 1 wherein the barrier layer is comprised of tantalum.

17. A process as claimed in claim 1 wherein the seed layer is comprised of copper.

18. A process as claimed in claim 1 wherein the protective layer is comprised of a material selected from the group consisting of nickel, nickel alloys, and chromium.

19. A process as claimed in claim 1 wherein the step of electroplating one or more copper elements is comprised of the steps of:
applying a pattern mask layer over the seed layer whereby the selected portions of the seed layer are exposed; and
electroplating the one or more copper elements onto the seed layer through the exposed selected portions.

20. A process for providing one or more protected copper elements on a surface of a workpiece, the process comprising the steps of:
applying a conductive barrier layer to the workpiece;
electroplating one or more copper elements on selected portions of the conductive barrier layer;
rendering at least a portion of a surface of the conductive barrier layer unplatable; and
electroplating a protective layer onto surfaces of the one or more copper elements.

21. A process as claimed in claim 20 and further comprising the step of applying a dielectric layer over at least a portion of the one or more copper elements.

22. A process as claimed in claim 20 and further comprising the steps of:
applying a dielectric layer to substantially cover the one or more copper elements;
removing a surface portion of the dielectric layer to expose one or more upper regions of the one or more copper elements.

23. A process as claimed in claim 20 wherein the step of rendering at least a portion of a surface of the barrier layer unplatable comprises the step of oxidizing exposed surfaces of the barrier layer material.

24. A process as claimed in claim 20 wherein the step of electroplating one or more copper elements on selected portions of the conductive barrier layer comprises the steps of:
electroplating one or more copper lines on selected portions of the conductive barrier layer; and
electroplating one or more copper posts on selective portions of the copper lines.

25. A process as claimed in claim 20 wherein the step of rendering at least a portion of a surface of the barrier layer unplatable comprises the steps of:
concurrently oxidizing exposed surfaces of the barrier layer material and the one or more copper elements;
removing the resultant copper oxide from the one or more copper elements.

26. A process as claimed in claim 20 and further comprising the step of removing the barrier layer, where it is not overlied by a copper element, after electroplating the protective layer.

27. A process as claimed in claim 20 wherein the barrier layer is applied in a first processing tool set.

28. A process as claimed in claim 27 wherein the wherein the electroplating steps and the rendering step are executed in a second processing tool set.

29. A process as claimed in claim 28 wherein the first processing tool set is a vacuum deposition tool set.

30. A process as claimed in claim 29 wherein the second processing tool set is a wet processing tool set.

31. A process as claimed in claim 27 wherein the first processing tool set is a vacuum deposition tool set.

32. A process as claimed in claim 20 wherein the barrier layer is comprised of titanium nitride.

33. A process as claimed in claim 20 wherein the protective layer is comprised of a material selected from the group consisting of nickel, nickel alloys, and chromium.

34. A process as claimed in claim 20 wherein the barrier layer comprises titanium nitride overlying tantalum nitride and wherein the protective layer is comprised of a material selected from the group consisting of nickel, nickel alloys, and chromium.

35. A process as claimed in claim 20 wherein the step of electroplating one or more copper elements is comprised of the steps of:
applying a pattern mask layer over the barrier layer whereby the selected portions of the conductive barrier layer are exposed; and
electroplating the one or more copper elements onto the conductive barrier layer through the exposed selected portions.

36. A process for providing one or more copper metallization layers on a surface of a semiconductor workpiece, the process comprising the steps of:
applying a barrier layer to the semiconductor workpiece;
applying a seed layer on the barrier layer;
electroplating one or more copper interconnect lines on selected portions of the seed layer;
electroplating one or more copper posts on selected portions of the copper interconnect lines;
substantially removing the seed layer;
concurrently oxidizing exposed surfaces of the one or more copper interconnect lines, exposed surfaces of the one or more copper posts, and exposed surfaces of the barrier layer;

removing resultant copper oxide layers from the one or more copper interconnect lines and the one or more copper posts while leaving the oxidized barrier layer surfaces substantially intact so as to leave the barrier layer surfaces unplatable;

electroplating a protective layer onto exposed surfaces of the one or more copper interconnect lines.

37. A process as claimed in claim 36 and further comprising the step of applying a dielectric layer over at least a portion of the one or more copper elements.

38. A process as claimed in claim 36 and further comprising the steps of:

applying a dielectric layer to substantially cover the one or more copper interconnect lines and the one or more copper posts;

removing a surface portion of the dielectric layer to expose upper regions of the one or more copper posts.

39. A process as claimed in claim 36 and further comprising the step of removing the barrier layer, where it is not overlied by an interconnect line, after electroplating the protective layer.

40. A process as claimed in claim 36 wherein the barrier layer and seed layer are applied in a first processing tool set.

41. A process as claimed in claim 40 wherein the wherein the electroplating steps and the oxidizing step are executed in a second processing tool set.

42. A process as claimed in claim 41 wherein the first processing tool set is a vacuum deposition tool set.

43. A process as claimed in claim 42 wherein the second processing tool set is a wet processing tool set.

44. A process as claimed in claim 40 wherein the first processing tool set is a vacuum deposition tool set.

45. A process as claimed in claim 36 wherein the step of electroplating one or more copper interconnect lines is comprised of the steps of:

applying a pattern mask layer over the seed layer whereby the selected portions of the seed layer are exposed; and electroplating the one or more copper interconnect lines onto the seed layer through the exposed selected portions.

46. A process as claimed in claim 45 wherein the step of electroplating one or more copper posts is comprised of the steps of:

applying a pattern mask layer over the seed layer and the one or more interconnect lines whereby selected upper portions of the copper interconnect lines are exposed; and electroplating the one or more copper posts onto the copper interconnects lines through the exposed portions.

47. A process as claimed in claim 36 wherein the barrier layer is comprised of tantalum.

48. A process as claimed in claim 36 wherein the seed layer is comprised of copper.

49. A process as claimed in claim 36 wherein the protective layer is comprised of a material selected from the group consisting of nickel, nickel alloys, and chromium.

50. A process as claimed in claim 36 wherein the step of substantially removing the seed layer concurrently occurs during the step of removing resultant copper oxide layers from the one or more copper interconnect lines and the one or more copper posts.

51. A process as claimed in claim 36 wherein the step of substantially removing the seed layer comprises the step of subjecting the seed layer to an electrolyte solution bath containing phosphoric acid while holding the seed layer at a positive electrical potential relative to an electrode that is immersed in the electrolyte solution bath.

* * * * *